United States Patent
Mito

(10) Patent No.: US 7,366,860 B2
(45) Date of Patent: Apr. 29, 2008

(54) STORAGE DEVICE CONFIGURED TO SEQUENTIALLY INPUT A COMMAND

(76) Inventor: Kumiko Mito, A202, 3-23, Higashitoyonaka-cho, Toyonaka-shi, Osaka (JP) 560-0003

( * ) Notice: Subject to any disclaimer, the term of this patent is extended or adjusted under 35 U.S.C. 154(b) by 255 days.

(21) Appl. No.: 11/263,952

(22) Filed: Nov. 2, 2005

(65) Prior Publication Data
US 2006/0109730 A1 May 25, 2006

(30) Foreign Application Priority Data
Nov. 15, 2004 (JP) ............................. 2004-330309

(51) Int. Cl.
*G06F 12/14* (2006.01)
(52) U.S. Cl. .................. 711/163; 711/164; 713/193; 365/195; 365/233; 365/189.07
(58) Field of Classification Search ................ 711/163, 711/164; 713/162, 190, 193; 365/189.07, 365/233, 195
See application file for complete search history.

(56) References Cited

U.S. PATENT DOCUMENTS 4,654,829 A * 3/1987 Jiang et al. ............ 365/189.03
6,804,752 B2 * 10/2004 Patterson et al. ........... 711/163
7,091,740 B2 * 8/2006 Simons ........................ 326/8

FOREIGN PATENT DOCUMENTS

JP 2002-91828 3/2002

* cited by examiner

*Primary Examiner*—Jack Lane
(74) *Attorney, Agent, or Firm*—Oblon, Spivak, McClelland, Maier & Neustadt, P.C.

(57) ABSTRACT

A storage device is capable of sequentially inputting a command, which includes address information and attached information, from an information processor through an input/output unit. The storage device includes a storage unit for storing data; an extractor for extracting the address information and the attached information from an input command inputted through the input/output unit; a generator for, in response to input of the input command, generating transition information that transitions according to rules using an initial value; a comparator for determining whether the attached information and the transition information agree with each other; and an output controller for, only when the attached information and the transition information agree with each other, outputting storage data out of the data, which corresponds to the address information extracted by the extractor, through the input/output unit.

9 Claims, 6 Drawing Sheets

1

F I G . 4 A

| INPUT COMMAND | No.1 | No.2 | No.3 | ······· |
|---|---|---|---|---|
| ADDRESS INFORMATION | a a a | b b b | c c c | ······· |
| PARAMETER | 2 | 4 | 6 | ······· |

F I G . 4 B

| COMPUTATION (COMMAND No.×2) | 1×2 | 2×2 | 3×2 | ······· |
|---|---|---|---|---|
| EXPECTED PARAMETER | 2 | 4 | 6 | ······· |

STORAGE DEVICE CONFIGURED TO SEQUENTIALLY INPUT A COMMAND

BACKGROUND OF THE INVENTION

1. Field of the Invention

The present invention relates to a storage device including, for example, built-in semiconductor memory, and especially relates to improvement for data security intensification within a storage device.

2. Description of the Background Art

Conventional information processors including image displays and the like can detachably connect storage devices storing software programs, data, and the like, thereby allowing execution of various software programs and utilization of data.

Some of such storage devices have security functions for security protection of data stored therein. For example, Japanese Patent Application Laid-open No. 2002-91828 has disclosed a method for encrypting messages using ID information stored in a storage device.

SUMMARY OF THE INVENTION

In storage devices without security functions, the same command is always used to read out data at the same address. Thus, there is a drawback that messages transmitted between information processors and such storage devices may be relatively easily analyzed because there are a number of cues that unauthorized outsiders can obtain from observation.

Further, even Japanese Patent Application Laid-open No. 2002-91828 has a drawback that the security of information stored in a storage device cannot be guaranteed, because the storage device first transmits information on encryption to an information processor and then carries out data communications according to this information. Thus, if messages transmitted between the storage device and the information processor are observed from the beginning, it will be possible to manufacture another storage device for reproducing the same messages.

It is an object of the present invention to provide a technique for protecting security of data stored in a storage device.

According to the present invention, the storage device is capable of sequentially inputting a command, which includes address information and attached information, from an information processor through an input/output unit. The storage device includes a storage unit for storing data; an extractor for extracting the address information and the attached information from an input command inputted through the input/output unit; a generator for, in response to input of the input command, generating transition information that transitions according to rules using an initial value; a comparator for determining whether the attached information and the transition information agree with each other; and an output controller for, only when the attached information and the transition information agree with each other, outputting storage data out of the data, which corresponds to the address information extracted by the extractor, through the input/output unit.

Only when the transition information that transitions according to rules and the attached information in the input command agree with each other, storage data out of the data, which corresponds to the address information, is outputted through the input/output unit. This results in data security intensification within the storage unit.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B are diagrams for explaining the relationship between a parameter in an input command and an expected parameter computed by an expected-parameter operation unit;

DESCRIPTION OF THE PREFERRED EMBODIMENTS

First Preferred Embodiment

<Main Configuration of Cartridge>

Figure 1:
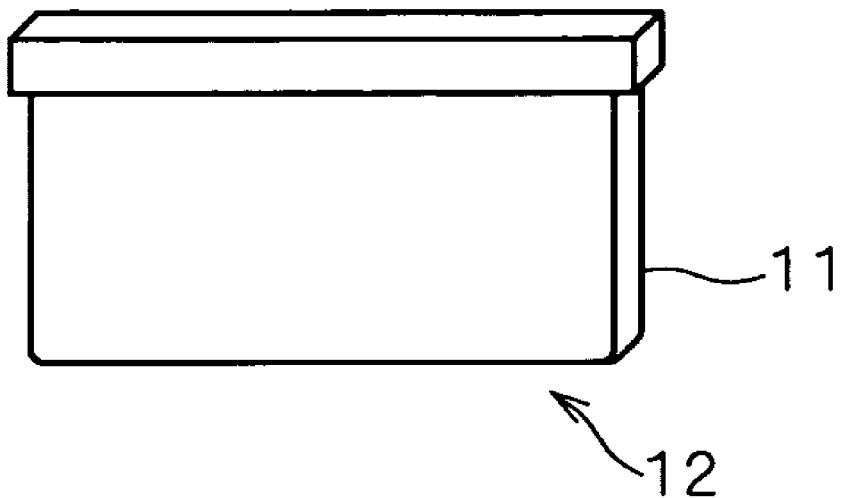
FIG. 1 is an external view showing the main configuration of a memory cartridge according to a first preferred embodiment of the present invention.

FIG. 1 is an external view showing the main configuration of a memory cartridge 1 according to a first preferred embodiment of the present invention.

The memory cartridge (hereinafter simply referred to as the "cartridge") 1 stores software programs and data therein and is configured to be detachably mounted on an information processor. Examples of information processors using software programs or data stored in the cartridge 1 include an image processor, a personal computer and portable information terminal equipment such as a personal digital assistant (PDA). There are also various other forms of information processors. For example, the present invention is also applicable to game cartridges storing game programs, and video or portable game machines which can detachably mount and use the game cartridges. In the following description, all those examples are described as information processors.

The cartridge 1 includes a plate-like body unit 11 equipped with electric circuits containing semiconductor memory and the like; and an input/output unit 12 provided under the body unit 11 and having, for example, a plurality of terminals. The cartridge 1 is mounted on an information processor, and thereby the input/output unit 12 is electrically connected to an input/output unit of the information processor. This permits data transmission between the cartridge 1 and the information processor.

Figure 2:
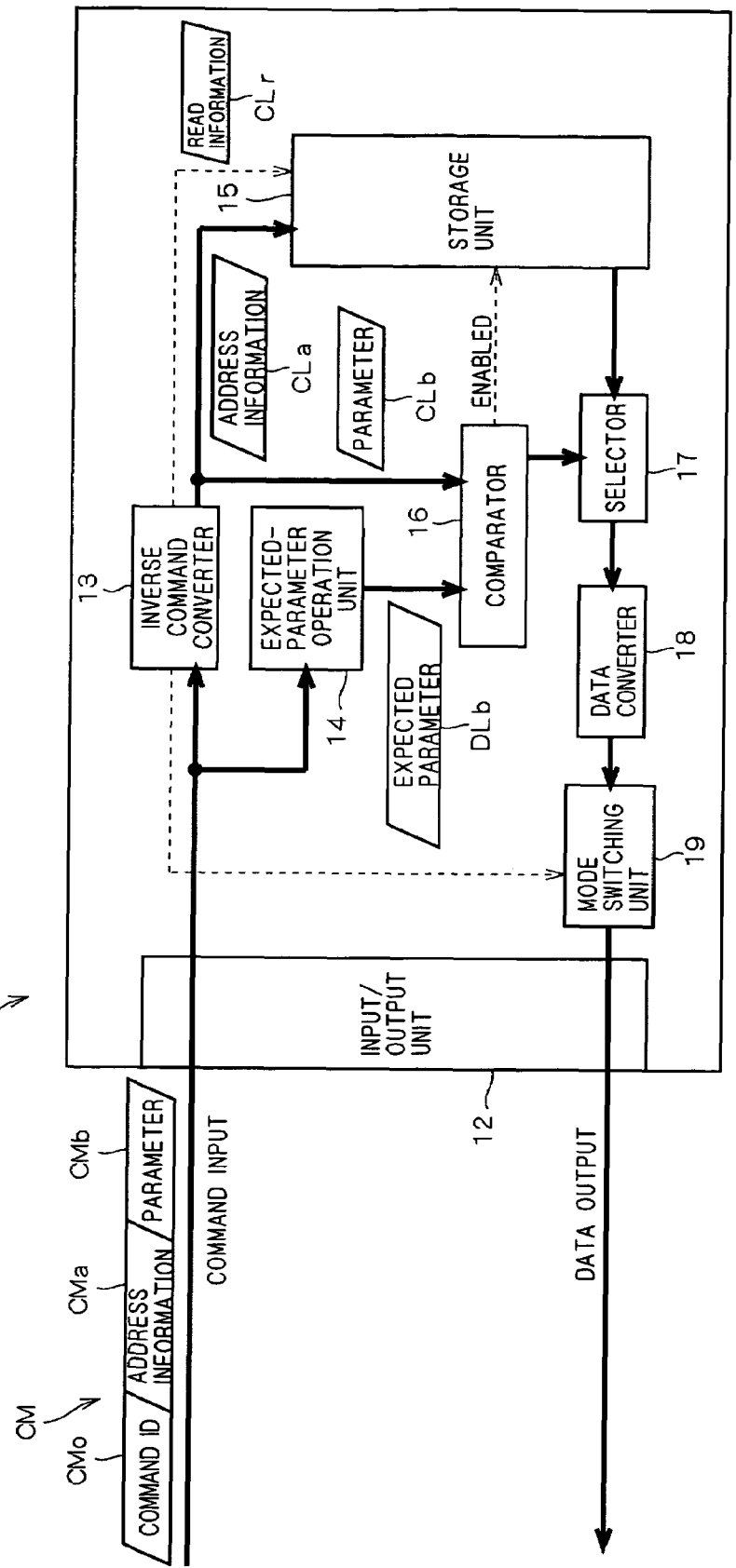
FIG. 2 is a function block diagram of the cartridge.

FIG. 2 is a function block diagram of the cartridge 1.

The cartridge 1 includes an inverse command converter 13 connected to the input/output unit 12 to allow data transmission, an expected-parameter operation unit 14, and a data converter 18. The cartridge 1 further includes a storage unit 15 and a comparator 16 which are connected to the inverse command converter 13 to allow data transmission, and a selector 17 connected to the storage unit 15 to allow data transmission. Further, a mode switching unit 19 is interposed between the input/output unit 12 and the data converter 18.

This cartridge 1 outputs necessary data from the input/output unit 12 in response to a command inputted from the information processor through the input/output unit 12. Here, the input command inputted to the cartridge 1 is a command (converted command) that has been converted by the information processor, and output data is also converted by the cartridge 1. Therefore, even if third parties observe input and output signals to and from the cartridge 1, it is difficult to analyze the contents of the signals. Hereinafter, each function block of this cartridge 1 will be described in detail.

The inverse command converter 13 has the function of inversely converting a converted command CM which has been converted by the information processor. This inverse data conversions correspond to data conversions performed to generate the converted command CM on the information processor side, so that its processing method has been determined previously. The inverse command converter 13 also extracts a command ID, address information CLa, and a parameter CLb after restoring the converted command CM to an original command.

The expected-parameter operation unit 14 computes an expected parameter DLb for each input of the converted command CM. This expected parameter DLb is transition information that transitions every input of the converted command CM on the basis of computations which will be described later.

The storage unit 15 is made of, for example, semiconductor memory such as ROM and stores data, such as game programs, that is usable by the information processor. This storage device 15 stores data for each address and allows extraction of storage data according to the address information CLa. Extracted storage data is transmitted to the selector 17. Semiconductor memory used here varies according to the usage of the cartridge 1. For example, the cartridge 1 for read use only may be unrecordable semiconductor memory such as mask ROM. And, the cartridge 1 for both read and write use, as described later, may for example be flash memory or the like. In the case of using flash memory or the like, it may be either volatile or nonvolatile according to applications.

The comparator 16 has the function of making a comparison between the parameter CLb extracted by the inverse command converter 13 and the expected parameter DLb obtained by the expected-parameter operation unit 14, to determine whether those parameters agree with each other. The result of the comparison is transmitted to the selector 17, and if the parameters agree with each other, the operation of the storage unit 15 is enabled.

The selector 17 reads out data or the like in the storage unit 15 according to the result of the comparison by the comparator 16 and transmits it to the data converter 18. More specifically, if the comparator 16 outputs the result that both the parameters CLb and DLb agree with each other, storage data read out from the storage unit 15 is transmitted as is to the data converter 18. On the other hand, if the comparator 16 outputs the result that both the parameters CLb and DLb disagree with each other, dummy data (different data), such as random data, that is different from storage data in the storage unit 15 is transmitted to the data converter 18.

The data converter 18 performs data conversions on storage data transmitted from the selector 17.

The mode switching unit 19 has the function of switching the cartridge 1 to an output mode. More specifically, when the command ID extracted by the inverse command converter 13 is a read signal that indicates the reading of storage data from the storage unit 15, the operation of the cartridge 1 is switched to the output mode, in which mode storage data read out from the storage unit 15 is converted by the data converter 18 and outputted as converted storage data from the input/output unit 12.

Data outputted from the input/output unit 12 is fed to the information processor, where inverse data conversions corresponding to the data conversions performed by the data converter 18 are performed to restore data stored in the storage unit 15. Thereby, data requested by the input command is obtained.

The aforementioned operation of each unit of the cartridge 1 is implemented by specific hardware and software operated by power supplied from the information processor through the input/output unit 12.

The data conversions performed by the data converter 18 and the inverse data conversions performed by the inverse command converter 13 may be implemented only by specific hardware, or they may be implemented by both specific hardware and software programs in order to allow easy modification of the contents of data conversions by change of the software programs.

While command input and data output through the input/output unit 12 are shown to be performed over different signal lines in FIG. 2, the present invention is not limited thereto. For example, signals are time divided so that both the input and output signals can be transmitted over a single signal line by switching.

<Operation of Cartridge>

Figure 3:
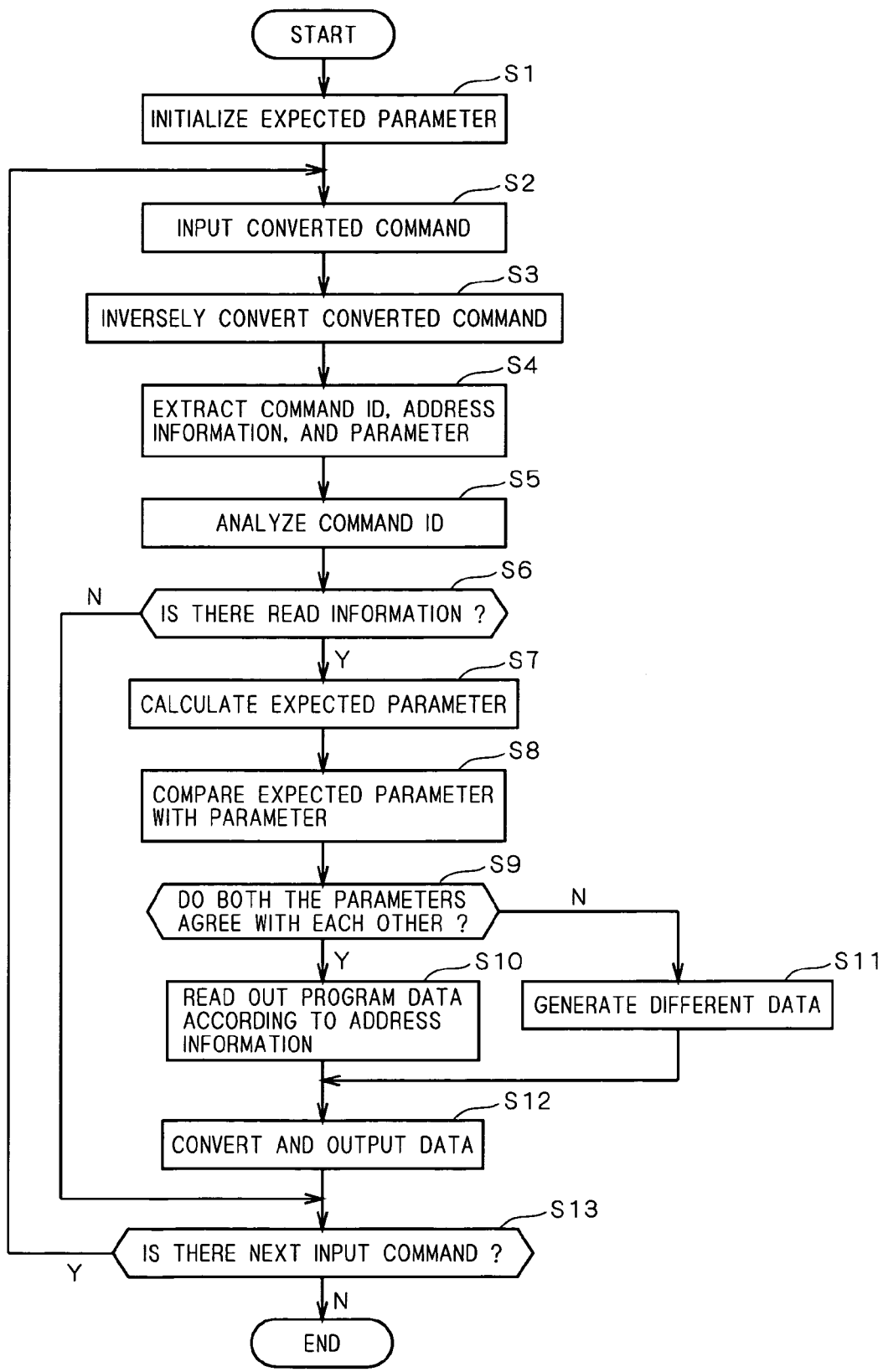
FIG. 3 is a flow chart for explaining the basic operation of the cartridge according to the first preferred embodiment.

FIG. 3 is a flowchart for explaining the basic operation of the cartridge 1. This operation is equivalent to processing in reading out data, such as game programs, stored in the cartridge 1. FIGS. 4A and 4B are diagrams for explaining the relationship between the parameter CMb (CLb) included in the input command CM and the expected parameter DLb computed by the expected-parameter operation unit 14. Hereinafter, the operation of the cartridge 1 in FIG. 2 will be described in detail with reference to FIGS. 3, 4A, and 4B.

In step S1, the expected-parameter operation unit 14 initializes the expected parameter DLb. This initialization is performed in response to an initialization command inputted from the information processor side. The initialization command includes an initial value for computation of the expected parameter DLb. After transmission and reception of this initialization command, using the initial value included in this command, the information processor starts to attach the parameter CMb to each input command, and the cartridge 1 starts to compute the expected parameter DLb. Like the input command which will be described later, the initialization command may also be converted on the information processor side and inversely converted on the cartridge 1 side.

In step S2, the converted command CM converted on the information processor side is inputted. This converted command CM is inputted in sequence to read out data in the storage unit 15, and includes the command ID (CMo), the address information CMa, and the parameter (attached information) CMb. More specifically, for example as shown in FIG. 4A, converted input commands, such as a command No. 1 (including address information "aaa" and a parameter "2"), a command No. 2 (including address information "bbb" and a parameter "4"), a command No. 3 (including address information "ccc" and a parameter "6") and so on, are inputted one after another. The parameters of those commands, "2", "4", "6", and so on, are information that is attached when the initial value in the initialization command is "2" on the information processor side, according to predetermined rules such that the parameters become the same as the values computed by the expected-parameter operation unit 14 which will be described later (in the present example, a rule of multiplying the initial value by the number of the input command).

In step S3, the inverse command converter 13 inversely converts the converted input command CM to restore it to an original command. That is, inverse data conversions corresponding to the data conversions performed on the information processor side are performed by the inverse command converter 13.

In step S4, the command ID, the address information CLa, and the parameter CLb are extracted from the restored command. Then, the address information CLa is transmitted to the storage unit 15, and the parameter CLb is transmitted to the comparator 16.

In step S5, the inverse command converter 13 analyzes the command ID extracted in step S4. More specifically, the inverse command converter 13 analyzes whether the command ID includes read information CLr that instructs the reading of data from the storage unit 15.

In step S6, it is determined whether the command ID analyzed in step S5 includes the read information CLr. If the read information CLr is included, the mode switching unit 19 switches the cartridge 1 to the output mode, and the read information CLr is transmitted to the storage unit 15 (FIG. 2). Then, the process goes to step S7. If the read information CLr is not included, the process goes to step S13.

In step S7, the expected-parameter operation unit 14 computes the expected parameter DLb which is numerical information. This computation will be described with reference to FIG. 4B.

When receiving the initialization command from the information processor in step S1, the expected-parameter operation unit 14 initializes the expected parameter DLb and starts to compute the expected parameter DLb from a predetermined arithmetic expression, using the initial value included in the initialization command. For example if the initial value is "2" and the arithmetic expression requires multiplication of the initial value and the number of the input command, the expected parameter DLb obtained by this arithmetic expression transitions from "2" to "4", "6", and so on every input of the input command as shown in FIG. 4B. On the information processor side, as above described, input commands CM each including an attached parameter as shown in FIG. 4A are sequentially generated subsequent to the initialization command and transmitted after conversions. Thus, after the transmission and reception of the initialization command for initialization of the expected parameter DLb in step S1, the parameter CMb attached to the input command CM inputted from the information processor will agree with the expected parameter DLb obtained by the expected-parameter operation unit 14 in the cartridge 1.

In step S1, the initial value included in the initialization command may not necessarily be a fixed value, and may be varied for each initialization command. More specifically, for example, a value obtained in random on the information processor side may be used as an initial value. In this case, the parameter CMb attached to the input command CM on the information processor side and the expected parameter DLb obtained by the expected-parameter operation unit 14 in the cartridge 1 are not always constant but will vary with the initial value.

Also, the method of computations for obtaining the parameter CMb and the expected parameter DLb may not necessarily be always the same, and may be changed. Further, while in the present example, after a single initialization of the expected parameter DLb in step S1, the processing of steps S2 to S13 is repeated, the present invention is not limited thereto. For example, the initialization of the expected parameter DLb may be performed at regular or irregular time intervals at any stage in steps S2 to S13, and the initial value and the computation method of the expected parameter DLb may be changed each time. More specifically, for example, both the information processor and the cartridge 1 may support plural kinds of corresponding computation methods of the parameter CMb or the expected parameter DLb. And, with the change of the initial value or at predetermined time intervals from the change of the initial value, the information processor and the expected-parameter operation unit 14 in the cartridge 1 each may operate by switching their corresponding computation methods. This allows the change of not only the value of the expected parameter DLb but also the computation method thereof.

In this way, changing the initial value and the computation method of the expected parameter DLb in order to prevent the expected parameter DLb from always taking the same value further improves security against third parties who attempt to analyze communications between the information processor and the cartridge 1.

In step S8, the comparator 16 makes a comparison between the parameter CLb extracted by the inverse command converter 13 and the expected parameter DLb computed by the expected-parameter operation unit 14.

In step S9, it is determined whether the expected parameter DLb and the parameter CLb agree with each other. If both the parameters CLb and DLb agree with each other, the process goes to step S10. If they disagree, the process goes to step S11.

As above described, the information processor attaches a parameter to each input command according to predetermined rules using the initial value, and the expected-parameter operation unit 14 computes the corresponding expected parameter DLb. Thus, the parameter CLb and the expected parameter DLb should agree with each other as long as the information processor and the cartridge 1 are properly used.

While to simplify the explanation, the parameter CLb and the expected parameter DLb shown in FIGS. 4A and 4B have a simple structure, they are actually made of complicated values. Further, input commands that can be observed over communications between the information processor and the cartridge 1 are subjected to data conversions. Therefore, for third parties to read out data from the cartridge 1, they must reproduce the input commands accurately before input to the cartridge 1. Otherwise, the expected parameter DLb and the parameter CLb will disagree with each other at the stage of step S9, and it is found that an invalid command has been inputted.

In step S10, data (storage data) such as program data in the storage unit 15 is read out according to the address information CLa. That is, only when the parameter CLb and the expected parameter DLb agree with each other, storage data out of data, which corresponds to the address information CLa, is transmitted to the data converter 18.

In step S11, the selector 17 generates different data (e.g., random data) from data stored in the storage unit 15. If the parameter CLb and the expected parameter DLb disagree with each other, there is a high possibility that an invalid command has been inputted by third parties. Thus, different data that is different from the one third parties want to receive, so-called dummy data, is generated and outputted. Since third parties cannot even determine whether this output is false or normal data, the output of dummy data will confuse third parties who attempt to read out data improperly. This improves the security of communications between the information processor and the cartridge 1.

The operation performed when the parameter CLb and the expected parameter DLb disagree with each other may be any form other than generating and outputting different data, unless normal data is outputted. For example, subsequent data output from the cartridge 1 may be stopped, or all communications with the information processor may be cut off.

In step S12, data transmitted from the selector 17 is converted by the data converter 18 and outputted from the input/output unit 12 through the mode switching unit 19. On the information processor side, the output data is subjected to inverse data conversions corresponding to the data conversions performed by the data converter 18 to be restored to original data for use by the information processor.

In step S13, the input/output unit 12 determines the presence or absence of the next command input. If there is the next command input, the process returns to step S2 to repeat the processing of steps S2 to S12. If there is no next command input, the operation of the cartridge 1 is completed.

Now, the aforementioned data conversions according to the present invention refer to two processing techniques: scrambling and encryption. Scrambling is a relatively easy data conversion such as changing the data structure, e.g., data alignment, according to predetermined rules. On the other hand, encryption is a complicated data conversion such as converting data itself according to an algorithm or the like using predetermined key information. The data conversions of input commands and the data conversions of output data each may use either the scrambling or encryption technique. More specifically, the inverse command converter 13 may perform processing based on encryption, and the data converter 18 may perform processing based on scrambling. In this case, in correspondence with such processing, the information processor performs data conversions based on encryption for generation of input commands to the cartridge 1 and performs inverse data conversions based on scrambling on output data from the cartridge 1.

For example, even if both the inverse command converter 13 and the data converter 18 perform processing based on encryption, it is not necessary that the contents of the encryption should be the same.

Further, the methods of data conversions performed by the inverse command converter 13 and the data converter 18 may not necessarily be always the same, and may be changed at regular or irregular time intervals. More specifically, the inverse command converter 13 and the data converter 18 each may be configured to be capable of performing plural kinds of inverse data conversions or data conversions, and may operate by switching the methods of inverse data conversions or data conversions with the change of the aforementioned initial value or the like. Accordingly, the information processor performs data conversions or inverse data conversions corresponding to the processing of the cartridge 1.

In this way, using not always the same method but varying the method of data conversions of input commands and output data further improves security against third parties who attempt to analyze communications between the information processor and the cartridge 1.

Further, it is desirable that scrambling or encryption should produce significantly different commands in appearance by conversions, for example even if input data differs only in part, e.g., input commands including the same command ID and the same address information differ only in their parameters CMb.

As so far described, since input commands each include a different parameter and are data converted, even the same command takes different forms in appearance. This makes difficult the analysis of input commands by third parties. Besides, the parameter varies with the initial value transmitted from the information processor to the cartridge 1, and messages change corresponding to this parameter change. Thus, it is also impossible to manufacture a cartridge that is capable of reproducing completely identical messages.

Further, the reading of data from the cartridge 1 is only possible when the parameter CLb (CMb) included in the input command and the expected parameter DLb computed within the cartridge 1 agree with each other in comparison. This achieves a high level of security for reading out of data stored in the cartridge 1. That is, the parameter CMb in the input command and the expected parameter DLb transition in time sequence, so that even if the same command is inputted with different timing, it is impossible to obtain accurate data. This consequently makes difficult the analysis of the security functions by third parties.

Furthermore, not only the input commands but also the output data are converted, which further intensifies security.

Second Preferred Embodiment

<Main Configuration of Cartridge>

Figure 5:
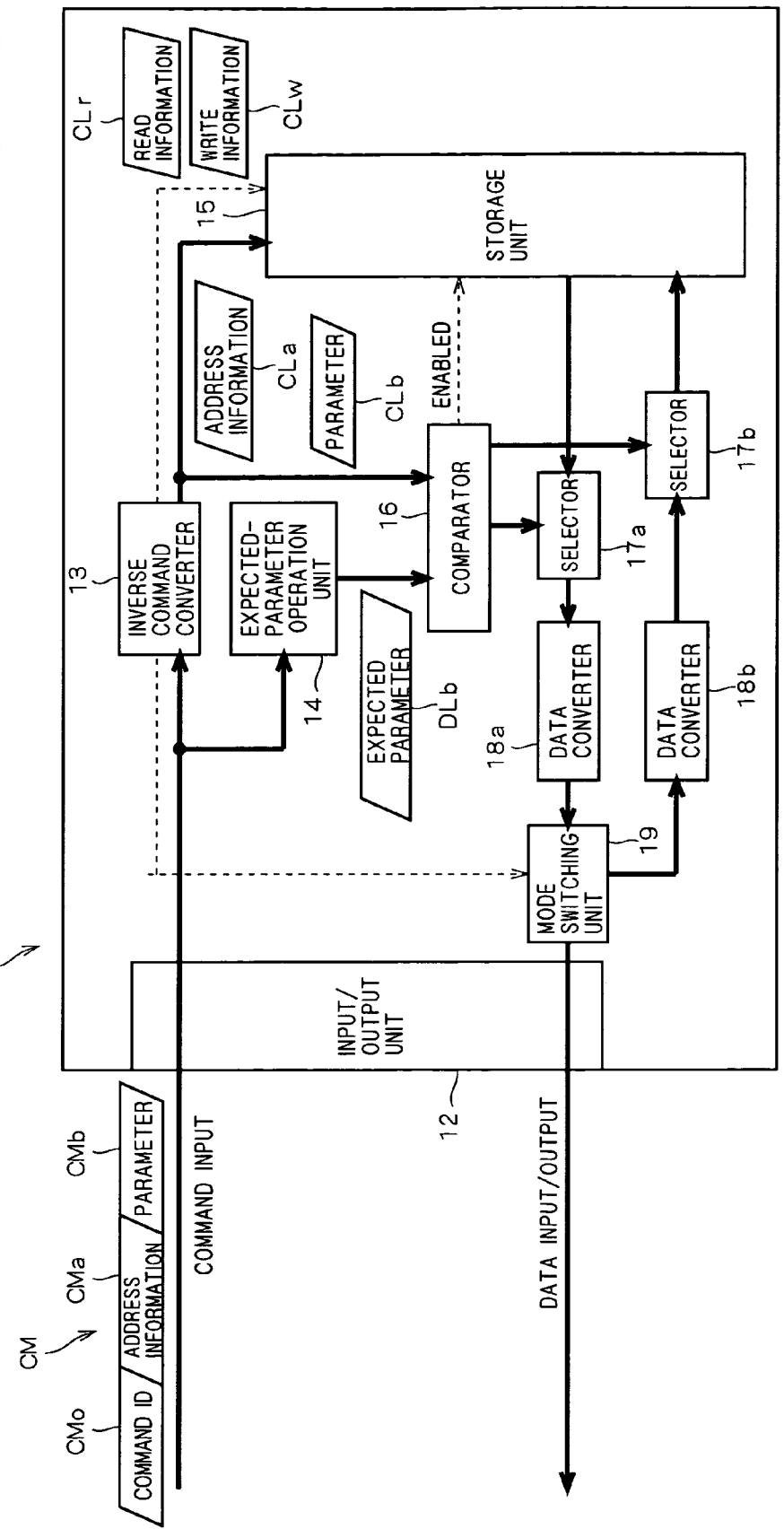
FIG. 5 is a function block diagram of a cartridge according to a second preferred embodiment of the present invention.

FIG. 5 is a function block diagram of a cartridge 3 according to a second preferred embodiment of the present invention. This preferred embodiment is also described taking an information processor as an example of a target for data transmission through the input/output unit 12.

Unlike the read-only cartridge 1 according to the first preferred embodiment, the cartridge 3 is both readable and writable. The cartridge 3 is configured such that a selector 17b and an inverse data converter 18b are additionally provided in the configuration of the cartridge 1.

The inverse data converter 18b performs inverse data conversions on data inputted to the cartridge 3 through the input/output unit 12. In the present example, the inverse data converter 18b performs inverse data conversions corresponding to data conversions performed on storage data on the information processor side, thereby to restore the storage data to original storage data. Storage data that the information processor request to write to the storage unit 15 may be inputted to the inverse data converter 18b after input of the input command CM, or it may be included in the input command CM and separated after input of the input command CM to be inputted to the inverse data converter 18b.

The selector 17b transmits data (original write data), which is outputted from the inverse data converter 18b according to the result of comparison by the comparator 16, to the storage unit 15. More specifically, if the output of the comparator 16 shows the agreement between both the parameters CLb and DLb, input data inputted through the input/output unit 12 is stored in a storage area of the storage unit 15 corresponding to the address information CLa. If the output of the comparator 16 shows the disagreement between the parameters CLb and DLb, storage of input data to the storage unit 15 is inhibited.

The storage unit 15 in the cartridge 3 is made of rewritable memory. The rewritable memory is, for example, writable semiconductor memory such as flash ROM or RAM. Thus, the storage unit 15 is both readable and writable as above described.

The mode switching unit 19 is a unit for switching the cartridge 3 between input and output modes. If the command ID extracted by the inverse command converter 13 includes a read signal that indicates the reading of data from the storage unit 15, the cartridge 3 is switched to the output mode. If the command ID includes a write signal that indicates the writing of data to the storage unit 15, the cartridge 3 is switched to the input mode.

The function and operation of the units other than those described in this preferred embodiment are identical to those described above in the first preferred embodiment.

<Operation of Cartridge>

Figure 6:
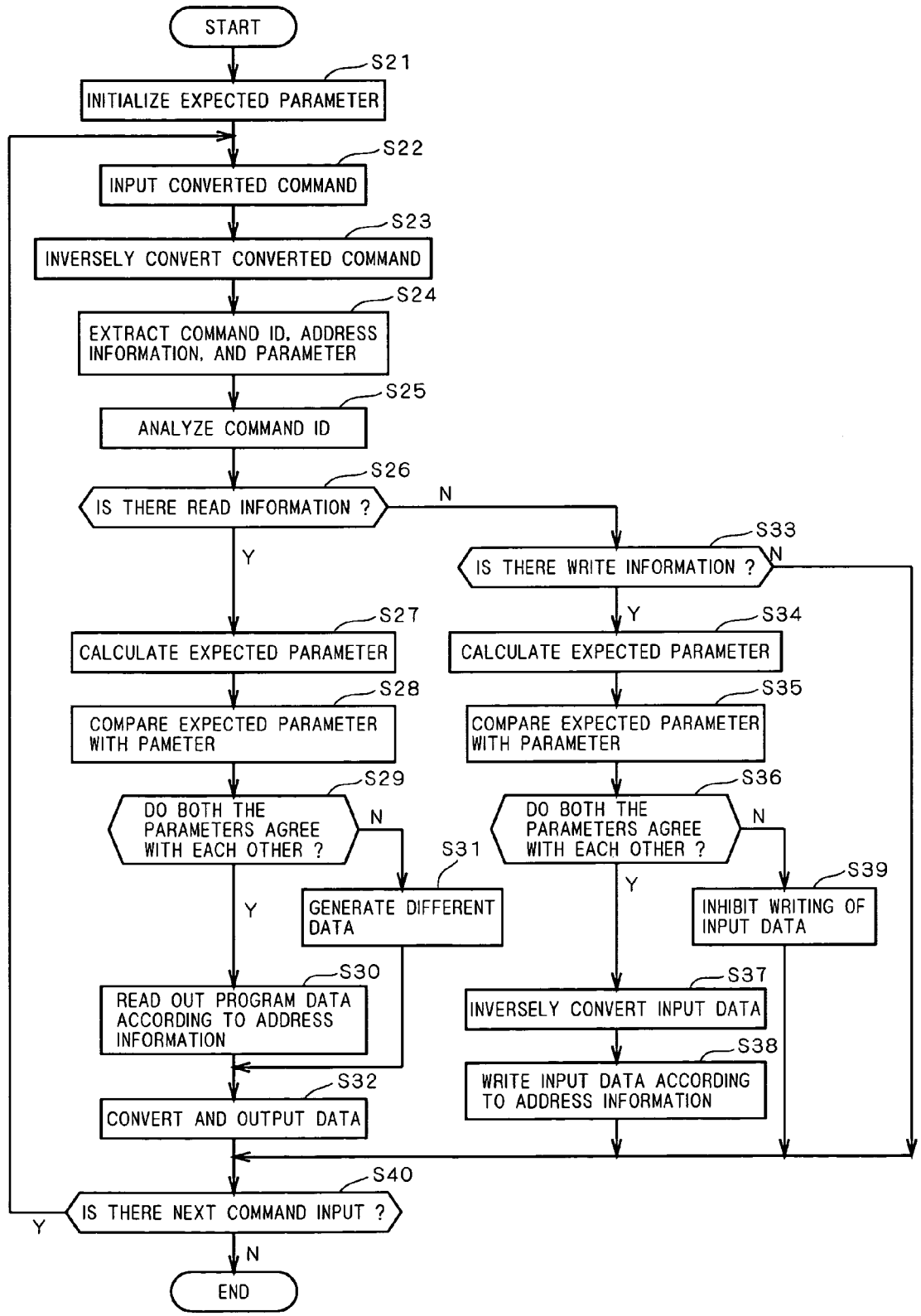
FIG. 6 is a flow chart for explaining the basic operation of the cartridge according to the second preferred embodiment.

FIG. 6 is a flow chart for explaining the basic operation of the cartridge 3. This operation is equivalent to processing in reading data stored in the cartridge 3 and in writing data to the cartridge 3.

Steps S21 to S32 perform similar processing to that of steps S1 to S12 shown in the flowchart of FIG. 3.

In step S33, it is determined whether the command ID analyzed in step S25 includes write information CLw. If the write information CLw is included, the mode switching unit 19 switches the cartridge 3 to the input mode, and the write information CLw is transmitted to the storage unit 15 (FIG. 5). Then, the process goes to step S34. If the write information CLw is not included, the process goes to step S40.

Steps S34 and S35 perform similar processing to that of steps S7 and S8 shown in the flowchart of FIG. 3.

In step S36, it is determined whether the expected parameter DLb and the parameter CLb agree with each other. If both the parameters CLb and DLb agree with each other, the process goes to step S37. If they disagree, the process goes to step S39.

In step S37, the inverse data converter 18b performs inverse data conversions on input data converted on the information processor side, thereby to restore the input data to original storage data.

In step S38, according to the address information CLa, the input data inversely converted in step S37 is written to the storage unit 15.

In step S39, the writing of input data inputted through the input/output unit 12 is inhibited. That is, if the parameter CLb and the expected parameter DLb disagree with each other, there is a high possibility that an invalid command has been inputted by third parties. This step effectively prevents such unfair practices.

In step S40, the input/output unit 12 determines whether there is the next command input. If there is the next command input, the process returns to step S22 to repeat the processing of steps S22 to S39. If there is no next command input, the operation of the cartridge 3 is completed.

The processing other than described in this preferred embodiment, such as the method of computation of the expected parameter DLb, inverse data conversions of the input command, data conversions of the output data, is similar to that described above in the first preferred embodiment.

The aforementioned operation of the cartridge 3, like that of the cartridge 1 according to the first preferred embodiment, can improve security of data stored in the cartridge 3. That is, the cartridge 3 can effectively prevent unfair practices by third parties, not only the reading of data from the cartridge 3 but also the writing of data to the cartridge 3.

(Modifications)

Program data in the storage unit 15 according to the aforementioned preferred embodiments may be in commonly-used data format, but should preferably be subjected to data conversions. This further improves security.

While the inverse command converter 13 and the data converter 18 of the first preferred embodiment in FIG. 2, or the inverse command converter 13, the data converter 18a, and the inverse data converter 18b of the second preferred embodiment in FIG. 5 are shown as separate components, a single component may achieve a processing unit for performing those data conversions.

Attached information such as the parameter CLb and the expected parameter DLb according to the present invention is not only limited to numerical information, but may be information containing only strings, or mixed information containing both numerical values and strings.

The security functions according to the present invention are controllable to be either enabled or disabled. Thus, the data conversions of input commands and the data conversions of output data each may be controlled on information equipment side using the present invention, according to the security functions of the information equipment.

While the invention has been shown and described in detail, the foregoing description is in all aspects illustrative and not restrictive. It is therefore understood that numerous modifications and variations can be devised without departing from the scope of the invention.

What is claimed is:

1. A storage device configured to sequentially input a command, which includes address information and attached information, from an information processor through an input/output unit, said storage device, comprising:
   a storage unit configured to store data;
   an extractor configured to extract said address information and said attached information from an input command inputted through said input/output unit;
   a generator configured to, in response to input of said input command, generate transition information that transitions according to rules using an initial value;
   a comparator configured to determine whether said attached information and said transition information agree with each other; and
   an output controller configured to, only when said attached information and said transition information agree with each other, output storage data out of said data, which corresponds to said address information extracted by said extractor, through said input/output unit.

2. The storage device according to claim 1, wherein said generator changes said initial value according to said input command.

3. The storage device according to claim 1, wherein said generator further changes said rules for generation of said transition information.

4. The storage device according to claim 1, wherein said output controller includes a converter configured to perform a data conversion on said storage data to generate converted storage data; and a controller configured to output said converted storage data through said input/output unit.

5. The storage device according to claim 4, wherein said converter is configured to change a method of said data conversion for generation of said converted storage data.

6. The storage device according to claim 1, wherein when said attached information and said transition information disagree with each other, said output controller outputs different data from said storage data through said input/output unit.

7. The storage device according to claim 1, wherein when said attached information and said transition information disagree with each other, said output controller stops data output through said input/output unit.

8. The storage device according to claim 1, wherein said input command is a converted command obtained by subjecting said command to data conversion, said extractor is configured to perform inverse data conversion corresponding to said data conversion on said converted command, thereby to restore said converted command to an original command, and to extract said address information and said attached information from said original command.

9. The storage device according to claim 8, wherein a method of said data conversion performed on said input command can be changed, and a method of said inverse data conversion is changed corresponding to said method of said data conversion.

* * * * *